United States Patent
Kim et al.

(10) Patent No.: US 9,136,991 B2
(45) Date of Patent: Sep. 15, 2015

(54) POWER AMPLIFYING CIRCUIT AND FRONT END MODULE INCLUDING THE SAME

(71) Applicant: SAMSUNG ELECTRO-MECHANICS CO., LTD., Suwon, Gyunggi-do (KR)

(72) Inventors: Ki Joong Kim, Gyunggi-do (KR); Nam Heung Kim, Gyunggi-do (KR); Young Jean Song, Gyunggi-do (KR); Myeong Woo Han, Gyunggi-do (KR); Jun Goo Won, Gyunggi-do (KR); Shinichi Iizuka, Gyunggi-do (KR); Youn Suk Kim, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 207 days.

(21) Appl. No.: 13/777,540

(22) Filed: Feb. 26, 2013

(65) Prior Publication Data
US 2014/0177493 A1    Jun. 26, 2014

(30) Foreign Application Priority Data

Dec. 20, 2012    (KR) .......................... 10-2012-0149972

(51) Int. Cl.
  *H04L 5/00*    (2006.01)
  *H04L 5/14*    (2006.01)
  *H01Q 1/50*    (2006.01)
  *H03F 1/56*    (2006.01)
  *H03F 3/191*    (2006.01)
  *H03F 3/24*    (2006.01)
  *H03F 3/72*    (2006.01)

(52) U.S. Cl.
CPC  *H04L 5/00* (2013.01); *H03F 1/565* (2013.01); *H03F 3/191* (2013.01); *H03F 3/245* (2013.01); *H03F 3/72* (2013.01)

(58) Field of Classification Search
USPC .................................. 370/297, 294; 343/861
See application file for complete search history.

(56) References Cited

U.S. PATENT DOCUMENTS

| | | | |
|---|---|---|---|
| 6,812,794 B1 | 11/2004 | Mori et al. | |
| 2009/0161586 A1* | 6/2009 | Kasai et al. | ................... 370/294 |
| 2010/0135193 A1* | 6/2010 | Przadka | ........................ 370/297 |
| 2014/0049442 A1* | 2/2014 | Yen et al. | ........................ 343/861 |

FOREIGN PATENT DOCUMENTS

| | | |
|---|---|---|
| JP | 2010-528498 A | 8/2010 |
| KR | 2002-0038569 | 5/2002 |
| KR | 10-2009-0066015 A | 6/2009 |

OTHER PUBLICATIONS

Notice of Office Action Korean Patent Application No. 10-2012-0149972 dated Dec. 19, 2013 with English translation.

* cited by examiner

*Primary Examiner* — Kiet G Tang
(74) *Attorney, Agent, or Firm* — NSIP Law

(57) ABSTRACT

There are provided a power amplifying circuit and a front end module including the same. The power amplifying circuit includes a signal amplifying unit amplifying and outputting a plurality of wireless signals having different frequency bands, and a diplexer circuit transferring at least one of the plurality of wireless signals output from the signal amplifying unit to an antenna, wherein the signal amplifying unit and the diplexer circuit include impedance matching circuits having different impedance matching ranges, respectively, and the impedance matching range of the diplexer circuit is continuous with that of the signal amplifying unit.

14 Claims, 3 Drawing Sheets

POWER AMPLIFYING CIRCUIT AND FRONT END MODULE INCLUDING THE SAME

CROSS-REFERENCE TO RELATED APPLICATIONS

This application claims the priority of Korean Patent Application No. 10-2012-0149972 filed on Dec. 20, 2012, in the Korean Intellectual Property Office, the disclosure of which is incorporated herein by reference.

BACKGROUND OF THE INVENTION

1. Field of the Invention

The present invention relates to a power amplifying circuit capable of having improved operational efficiency and manufacturing yield and reducing manufacturing costs by including impedance matching circuits distributed and disposed in an amplifying circuit unit amplifying a plurality of wireless signals having different frequency bands and a filter selectively transmitting or receiving at least one of the plurality of wireless signals, and a front end module including the same.

2. Description of the Related Art

As mobile apparatuses such as smartphones, tablet personal computers (PCs), and the like, transmitting and receiving data using wireless communications have been rapidly popularized, research into a dual band communications module providing wireless communications based on wireless signals in different frequency bands has been actively undertaken. Therefore, a large number of recently released mobile apparatuses such as smartphones, tablet PCs, and the like, are provided with a function able to perform communications using a plurality of wireless signals having different frequency bands. Therefore, a dual band access point (AP) product setting a wireless local area network (LAN) using wireless signals having different frequency bands has also been released.

A general front end module performing communications based on wireless signals having different frequency bands includes a driving circuit controlling transmission and reception of the wireless signals, an amplifying circuit amplifying the wireless signals to be transmitted, and a filter filtering the transmitted and received wireless signals. In this case, impedance matching between an output terminal of the amplifying circuit outputting the wireless signal and an input terminal of the filter transferring the wireless signal to an antenna or receiving the wireless signal from the antenna should be appropriately performed in order to prevent wireless communications efficiency from being deteriorated.

An existing front end module includes a circuit capable of varying impedance from 5 ohms to 50 ohms and an output matching circuit in order to perform the impedance matching between the output terminal of the amplifying circuit and the input terminal of the filter. However, in the case of configuring the circuit as described above, the overall manufacturing costs of the front end module may be increased, and a high degree of resistance loss may occur due to an inductor included in the matching circuit.

In the related art documents below, Patent Document 1, relating to a front end module for local area wireless communications, discloses a circuit including a power amplifying device and a filter. Patent Document 2, relating to a multi-stage amplifier, includes an amplifying device amplifying power and a multi-stage matching circuit as its components. However, neither Patent Document 1 nor Patent Document 2 discloses a configuration of distributing and implementing impedance matching circuits in an amplifying circuit and a filter and setting impedance matching ranges of the impedance matching circuits included in the amplifying circuit and the filter to be continuous.

RELATED ART DOCUMENT (Patent Document 1) Korean Patent Laid-Open Publication No. 10-2009-0066015
(Patent Document 2) Korean Patent Laid-Open Publication No. 10-2002-0038569

SUMMARY OF THE INVENTION

An aspect of the present invention provides a power amplifying circuit having improved operational efficiency and higher manufacturing yields while having reduced manufacturing costs by including impedance matching circuits distributed and implemented in an amplifying circuit unit amplifying wireless signals and a filter unit disposed between an antenna and the amplifying circuit unit and filtering the wireless signals, and a front end module including the same.

According to an aspect of the present invention, there is provided a power amplifying circuit including: a signal amplifying unit amplifying and outputting a plurality of wireless signals having different frequency bands; and a diplexer circuit transferring at least one of the plurality of wireless signals output from the signal amplifying unit to an antenna, wherein the signal amplifying unit and the diplexer circuit include impedance matching circuits having different impedance matching ranges, respectively, and the impedance matching range of the diplexer circuit is continuous with that of the signal amplifying unit.

The signal amplifying unit may include a first signal amplifier amplifying a first wireless signal having a first frequency band and a second signal amplifier amplifying a second wireless signal having a second frequency band different from the first frequency band.

The diplexer circuit may include a first filter allowing the first wireless signal to pass therethrough and the second wireless signal to be blocked thereby and a second filter allowing the second wireless signal to pass therethrough and the first wireless signal to be blocked thereby.

At least one of the first and second filters may share at least one circuit device with the impedance matching circuit included in the diplexer circuit.

The first frequency band may be a band of 2.4 GHz and the second frequency band may be a band of 5 GHz.

The signal amplifying unit may include an inductor matching impedance in an output terminal of the signal amplifying unit, and a coupler detecting power of at least one of the plurality of wireless signals output from the signal amplifying unit.

The power amplifying circuit may further include a switch circuit transferring at least one of the plurality of wireless signals output from the signal amplifying unit to the diplexer circuit.

According to another aspect of the present invention, there is provided a front end module including: a signal amplifying unit amplifying a plurality of wireless signals having different frequency bands; a driving circuit unit controlling an operation of the signal amplifying unit; and a filter unit transferring at least one of the plurality of wireless signals output from the signal amplifying unit to an antenna and transferring the wireless signals received through the antenna to the driving circuit unit, wherein the filter unit includes a plurality of filters filtering and blocking the plurality of wireless signals, and the signal amplifying unit and the filter unit include impedance matching circuits having different impedance matching ranges, respectively.

The front end module may further include a switch circuit transferring the wireless signals between the signal amplifying unit and the filter unit.

The front end module may further include a low noise amplifier (LNA) amplifying the wireless signals received through the antenna and transferring the amplified wireless signals to the driving circuit unit.

The signal amplifying unit may amplify a first wireless signal having a band of 2.4 GHz and a second wireless signal having a band of 5 GHz.

The first wireless signal may be transferred to the antenna through a low pass filter included in the filter unit, and the second wireless signal may be transferred to the antenna through a high pass filter included in the filter unit.

The signal amplifying unit may include a coupler detecting power of at least one of the plurality of wireless signals output from the signal amplifying unit.

The signal amplifying unit may include an inductor matching impedances in an output terminal of the signal amplifying unit.

The impedance matching range of the impedance matching circuit included in the signal amplifying unit and the impedance matching range of the impedance matching circuit included in the filter unit may be continuous.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
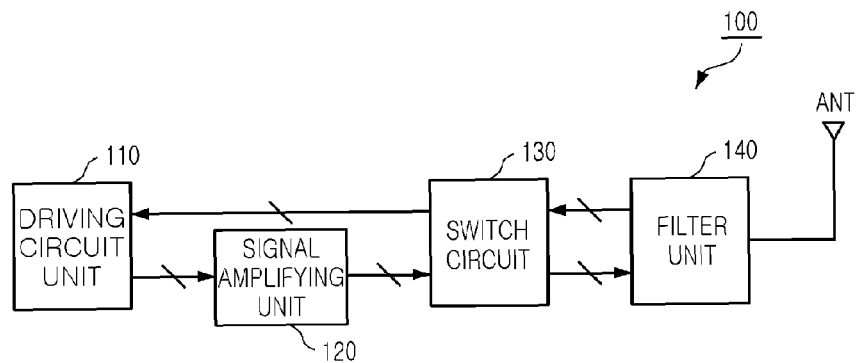
FIG. 1 is a block diagram schematically illustrating a front end module according to an embodiment of the present invention.

FIG. 1 is a block diagram schematically illustrating a front end module according to an embodiment of the present invention.

Referring to FIG. 1, the front end module 100 according to the present embodiment may include a driving circuit unit 110, a signal amplifying unit 120, a switch circuit 130, and a filter unit 140. The filter unit 140 may be connected to an antenna ANT and transmit and receive a wireless signal through the antenna ANT.

Referring to FIG. 1, a transfer path of wireless signals transmitted by the driving circuit unit 110 and a transfer path of wireless signals received by the driving circuit unit 110 are represented as being different from each other. That is, the wireless signals to be transmitted to the outside through the antenna ANT may be amplified by the signal amplifying unit 120 and then transferred to the filter unit 140 through the switch circuit 130.

On the other hand, the wireless signals received through the antenna ANT may be received in the driving circuit unit 110 through the filter unit 140 and the switch circuit 130. However, the present invention is not necessarily limited to the above-mentioned configuration. That is, the wireless signals received through the antenna ANT may be amplified by a low noise amplifier (LNA) included in the switch circuit 130 and then transferred to the driving circuit unit 110.

The signal amplifying unit 120 may amplify the wireless signals transferred by the driving circuit unit 110. Therefore, the signal amplifying unit 120 may include at least one amplifying device amplifying the wireless signals and a matching circuit matching impedance of output signals.

The signal amplifying unit 120 may amplify and output a plurality of wireless signals having different frequency bands. In the embodiment of the present invention, the signal amplifying unit may include a first signal amplifier amplifying a first wireless signal having a first frequency band and a second signal amplifier amplifying a second wireless signal having a second frequency band different from the first frequency band.

The switch circuit 130 may include a switch device relaying transmission and reception of the wireless signals between the signal amplifying unit 120 and the filter unit 140. For example, in the case in which the wireless signals to be amplified by the signal amplifying unit 120 and then output to the antenna ANT are a plurality of signals having different frequency bands, the switch device may be implemented as a switch device such as a single pole double throw (SPDT), a single pole triple throw (SP3T), or the like.

The filter unit 140 may filter noise components included in the wireless signals transmitted and received through the antenna ANT. In particular, the filter unit 140 may also include a plurality of filters, such that when the plurality of wireless signals having different frequency bands are amplified by the signal amplifying unit 120 and transferred to the filter unit 140 as described above, the plurality of wireless signals having different frequency bands may pass therethrough or may be blocked thereby.

In the embodiment of the present invention, the filter unit 140 may be implemented by a diplexer circuit transferring at least one of the plurality of wireless signals output from the signal amplifying unit 120, to the antenna.

Here, the diplexer circuit may include a first filter allowing the first wireless signal to pass therethrough and the second wireless signal to be blocked thereby and a second filter allowing the second wireless signal to pass therethrough and the first wireless signal to be blocked thereby. For example, the diplexer circuit may include a high pass filter and a low pass filter.

In the embodiments of the present invention, matching circuits may be separately provided in the respective different units.

That is, in a general front end module, an output matching circuit capable of varying impedance is included in the signal amplifying unit 120 and a plurality of inductors and capacitors are connected to an output terminal in order to perform impedance matching. For example, in the case in which a matching circuit for impedance matching from 5 to 50 ohms is implemented only in the signal amplifying unit 120, the overall manufacturing costs have increased, and efficiency has decreased.

Therefore, in the embodiment of the present invention, a portion of devices of the matching circuit may be included in the filter unit 140, and a remainder of the devices thereof may be included in the signal amplifying unit 120. For example, the signal amplifying unit 120 and the diplex circuit configuring the filter unit 140 may include an impedance matching circuit having a different impedance matching range.

In the embodiment of the present invention, in order to perform effective impedance matching, an impedance matching range of the matching circuit device included in the signal amplifying unit 120 and an impedance matching range of the matching circuit device included in the filter unit 140 may be continuous. For example, in the case in which the matching circuit device included in the signal amplifying unit 120 matches impedance of an output terminal from 5 ohms to 30 ohms, the matching circuit device included in the filter unit 140 may match impedance from 30 ohms to 50 ohms.

When the devices included in the matching circuit for the impedance matching are distributed and disposed in the signal amplifying unit 120 and the filter unit 140 as described above, the output may be matched while the filter unit 140 uses a filter removing harmonic components, that is, simultaneously with each other. Therefore, since a shunt circuit for removing the harmonic components of the amplified wireless signals may be omitted, a chip size and manufacturing costs may be decreased.

Hereinafter, circuit configurations of the signal amplifying unit 120 and the filter unit 140 included in the front end module 100 according to the embodiment of the present invention will be described with reference to FIGS. 2 through 4.

Figure 2:
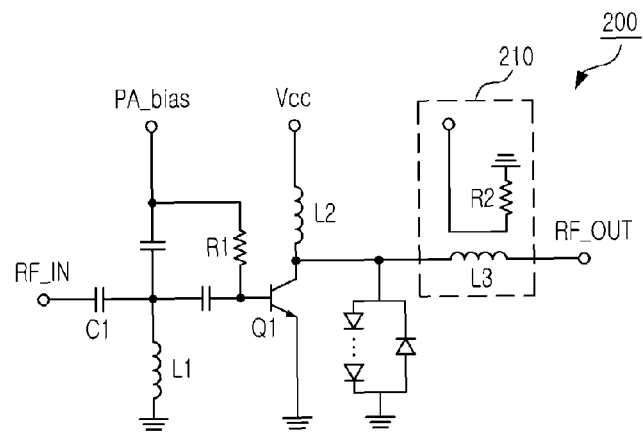
FIG. 2 is a circuit diagram illustrating an example of a circuit configuration of a signal amplifying unit included in the front end module according to the embodiment of the present invention.

FIG. 2 is a circuit diagram illustrating an example of a circuit configuration of a signal amplifying unit included in the front end module according to the embodiment of the present invention.

Referring to FIG. 2, the signal amplifying unit 200 according to the present embodiment may receive wireless signals to be amplified through an input terminal RF_IN, may amplify the wireless signals in an amplifier Q1, and may output the amplified wireless signal to an output terminal RF_OUT. The output terminal RF_OUT may be connected to the filter unit 140 through the switch circuit 130.

A capacitor C1 connected to the input terminal RF_IN may block a direct current (DC) component included in the input wireless signal, and an inductor L1 may be an inductor for impedance matching of the input terminal. A driving voltage Vcc required for operating the amplifier Q1 may be transferred to the amplifier Q1 through a choke coil L2 for removing a high frequency component. An inductor L3 may be connected as a matching circuit for primary impedance matching to an output terminal of the amplifier Q1, and a coupler 210 detecting an output wireless signal may be provided at the output terminal of the amplifier Q1.

Figure 3:
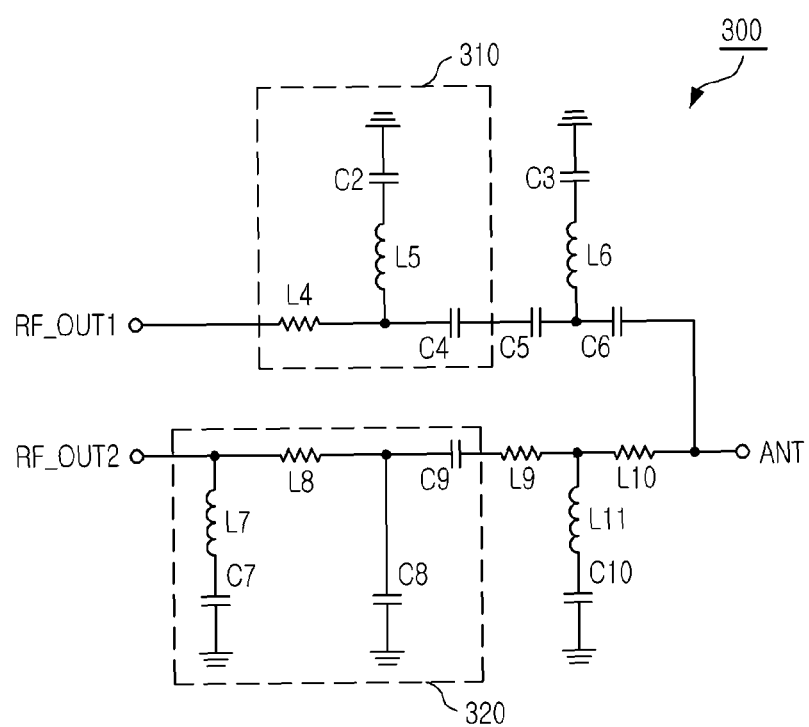
FIG. 3 is a circuit diagram illustrating an example of a circuit configuration of a filter unit included in the front end module according to the embodiment of the present invention.

FIG. 3 is a circuit diagram illustrating an example of a circuit configuration of a filter unit included in the front end module according to the embodiment of the present invention.

Referring to FIG. 3, the filter unit 300 according to the present embodiment may have a plurality of input terminals RF_OUT1 and RF_OUT2 of which each receives a plurality of wireless signals having different frequency bands. An output terminal of the filter unit 300 may be connected to the antenna ANT.

As described above, the front end module 100 according to the embodiment of the present invention may amplify the plurality of wireless signals having the different frequency bands and transfer the amplified wireless signals to the antenna ANT through the filter unit 300. For example, a dual band wireless communication apparatus transmitting and receiving wireless signals having frequency bands of 2.4 GHz and 5 GHz may receive the wireless signal having the frequency band of 5 GHz through the input terminal RF_OUT1 of the filter unit 300 and receive the wireless signal having the frequency band of 2.4 GHz through the input terminal RF_OUT2 of the filter unit 300. In this configuration, in order to efficiently perform filtering, a high pass filter may be selected as a circuit connected to the input terminal RF_OUT1, and a low pass filter may be selected as a circuit connected to the input terminal RF_OUT2.

In an example of a circuit configuration of the filter unit 300 shown in FIG. 3, a capacitor C4 included in a first filter 310, and an inductor L7 and a capacitor C7 included in a second filter 320 may be removed. In addition, in manufacturing the filter unit 300, an integrated passive device (IPD) process in which a high frequency silicon substrate and a copper (Cu) wiring of 10 μm are used may be used.

In addition, matching circuits 310 and 320 for impedance matching in the circuit configuration of the filter unit 300 may share at least one of the circuit devices with the filter circuit filtering the wireless signals received through the input terminals RF_OUT1 and RF_OUT2. Therefore, in the front end module 100, as a whole, the number of circuit devices may be decreased. In addition, the IPD process may be implemented in the same area as that of a GaAs HTB process, and the same component deviation may also be provided, and thus, since resistance loss may be reduced and reliability may be more excellent, yield may be improved and manufacturing costs may be decreased.

Figure 4:
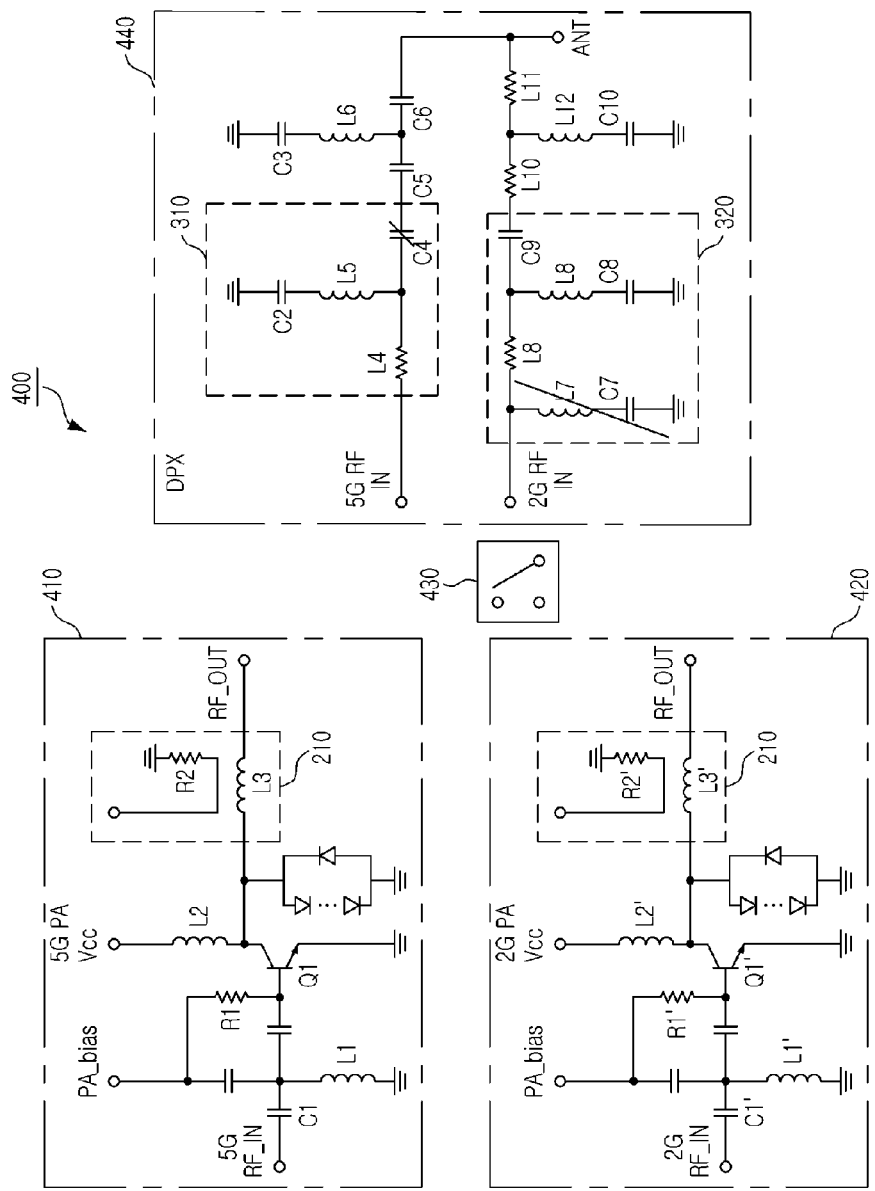
FIG. 4 is a circuit diagram illustrating an example of a power amplifying circuit according to the embodiment of the present invention.

FIG. 4 is a circuit diagram illustrating an example of a power amplifying circuit according to the embodiment of the present invention.

Referring to FIG. 4, the power amplifying circuit 400 according to the present embodiment may include a first signal amplifying unit 410 amplifying a wireless signal having a frequency band of 5 GHz, a second signal amplifying unit 420 amplifying a wireless signal having a frequency band of 2.4 GHz, a switch circuit 430, and a diplexer circuit 440.

Circuit configurations of the first and second signal amplifying units 410 and 420 may be substantially similar to each other and may be similar to the signal amplifying unit 200 described with reference to FIG. 2. Capacitors C1 and C1' for blocking DC components included in the wireless signals may be connected to input terminals RF_IN and RF_IN', respectively, and driving voltages Vcc2 of amplifiers Q1 and Q1' may be transferred to the amplifiers Q1 and Q1' through choke coils L2 and L2' for removing high frequency components, respectively. In addition, couplers detecting output wireless signals may be connected to output terminals of the signal amplifying units 410 and 420, respectively.

In addition, as described above with reference to FIG. 2, matching circuits for impedance matching may be distributed and disposed in the first and second signal amplifying units 410 and 420 and the diplexer circuit 440 serving as a filter. In the first and second signal amplifying units 410 and 420, inductors L3 and L3' connected to the output terminals, respectively, may match impedance. Here, as in the example described above, the impedance of the output terminals of the signal amplifying units 410 and 420 may be matched from 5 ohms to 30 ohms.

On the other hand, the diplexer circuit 440 may have a configuration slightly different from that of the filter unit 300 shown in FIG. 3. That is, as described above with reference to FIG. 3, in the filter receiving the wireless signal of 5 GHz and transferring the wireless signal to the antenna ANT, the capacitor C4 may be excluded, and in the filter receiving the wireless signal of 2.4 GHz and transferring the wireless signal to the antenna ANT, a portion of a circuit including the inductor L7 and the capacitor C7 connected in series with each other may be excluded. The capacitors C4 and C7 and the inductor L7 that are excluded from the diplexer circuit 440 may be devices for removing harmonic components. In the circuit shown in FIG. 4, since both of the filter capable of removing the harmonic components and the matching circuit may be implemented in the diplexer circuit 440, a separate device for removing the harmonic components may be omitted. Therefore, the overall current loss is decreased, whereby gain and efficiency may be increased. In addition, in view of the entire front end module 100, since a delay time required for amplifying the signal is decreased, a phase change is decreased, whereby an error vector magnitude (EVM) may be improved.

As set forth above, according to the embodiments of the present invention, the matching circuits for impedance matching between the output terminal of the amplifying circuit unit and the input terminal of the filter unit are distributed and implemented in the amplifying circuit unit and the filter unit. Therefore, inductance is lowered at the output terminal of the amplifying circuit unit, whereby the operational efficiency may be improved, and the matching circuit included in the filter unit also performs an operation for removing the harmonic components, such that the shunt circuit for removing the harmonic components may be omitted, whereby the chip size and the manufacturing costs may be decreased. Further, the matching circuit included in the filter unit is manufactured by the IPD process indicating excellent high frequency characteristics and yield to decrease high frequency loss, whereby gain may be raised.

While the present invention has been shown and described in connection with the embodiments, it will be apparent to those skilled in the art that modifications and variations can be made without departing from the spirit and scope of the invention as defined by the appended claims.

What is claimed is:

1. A power amplifying circuit comprising:
a signal amplifier amplifying and outputting a plurality of wireless signals having different frequency bands; and
a diplexer circuit transferring at least one of the plurality of wireless signals output from the signal amplifier to an antenna,
wherein the signal amplifier and the diplexer circuit include impedance matching circuits having different impedance matching ranges, respectively, and
the impedance matching range of the impedance matching circuit included in the diplexer circuit is continuous with the impedance matching range of the impedance matching circuit included in the signal amplifier.

2. The power amplifying circuit of claim 1, wherein the signal amplifier includes a first signal amplifier amplifying a first wireless signal having a first frequency band and a second signal amplifier amplifying a second wireless signal having a second frequency band different from the first frequency band.

3. The power amplifying circuit of claim 2, wherein the diplexer circuit includes a first filter allowing the first wireless signal to pass therethrough and the second wireless signal to be blocked thereby and a second filter allowing the second wireless signal to pass therethrough and the first wireless signal to be blocked thereby.

4. The power amplifying circuit of claim 3, wherein at least one of the first and second filters shares at least one circuit device with the impedance matching circuit included in the diplexer circuit.

5. The power amplifying circuit of claim 2, wherein the first frequency band is a band of 2.4 GHz and the second frequency band is a band of 5 GHz.

6. The power amplifying circuit of claim 1, wherein the signal amplifier includes:
an inductor matching impedance in an output terminal of the signal amplifier; and
a coupler detecting power of at least one of the plurality of wireless signals output from the signal amplifier.

7. The power amplifying circuit of claim 1, further comprising a switch circuit transferring at least one of the plurality of wireless signals output from the signal amplifier to the diplexer circuit.

8. A front end module comprising:
a signal amplifier amplifying a plurality of wireless signals having different frequency bands;
a driving circuit controlling an operation of the signal amplifier; and
a filter transferring at least one of the plurality of wireless signals output from the signal amplifier to an antenna and transferring the wireless signals received through the antenna to the driving circuit,
wherein the filter includes a plurality of filters filtering and blocking the plurality of wireless signals,
the signal amplifier and the filter include impedance matching circuits having different impedance matching ranges, respectively, and
the impedance matching range of the impedance matching circuit included in the signal amplifier and the impedance matching range of the impedance matching circuit included in the filter are continuous.

9. The front end module of claim 8, further comprising a switch circuit transferring the wireless signals between the signal amplifier and the filter.

10. The front end module of claim 8, further comprising a low noise amplifier (LNA) amplifying the wireless signals received through the antenna and transferring the amplified wireless signals to the driving circuit.

11. The front end module of claim 8, wherein the signal amplifier amplifies a first wireless signal having a band of 2.4 GHz and a second wireless signal having a band of 5 GHz.

12. The front end module of claim 11, wherein the first wireless signal is transferred to the antenna through a low pass filter included in the filter, and the second wireless signal is transferred to the antenna through a high pass filter included in the filter.

13. The front end module of claim 8, wherein the signal amplifier includes a coupler detecting power of at least one of the plurality of wireless signals output from the signal amplifier.

14. The front end module of claim 8, wherein the signal amplifier includes an inductor matching impedances in an output terminal of the signal amplifier.

* * * * *